United States Patent
Yen et al.

(10) Patent No.: US 12,062,480 B2
(45) Date of Patent: *Aug. 13, 2024

(54) INDUCTOR DEVICE

(71) Applicant: Realtek Semiconductor Corporation, Hsinchu (TW)

(72) Inventors: Hsiao-Tsung Yen, Hsinchu (TW); Jian-You Chen, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 746 days.

This patent is subject to a terminal disclaimer.

(21) Appl. No.: 17/014,063

(22) Filed: Sep. 8, 2020

(65) Prior Publication Data

US 2021/0074465 A1    Mar. 11, 2021

Related U.S. Application Data

(60) Provisional application No. 62/898,618, filed on Sep. 11, 2019.

(30) Foreign Application Priority Data

Aug. 7, 2020    (TW) .................................. 109126927

(51) Int. Cl.
| | | |
|---|---|---|
| H01F 27/28 | (2006.01) | |
| H01F 27/29 | (2006.01) | |
| H01F 27/40 | (2006.01) | |

(52) U.S. Cl.
CPC ......... *H01F 27/2804* (2013.01); *H01F 27/29* (2013.01); *H01F 27/40* (2013.01); *H01F 2027/2809* (2013.01)

(58) Field of Classification Search
CPC ........ H01F 27/2804; H01F 2027/2809; H01F 17/0013; H01F 17/0006; H01F 5/003;
(Continued)

(56) References Cited

U.S. PATENT DOCUMENTS

| | | |
|---|---|---|
| 2007/0268007 A1 | 11/2007 | Rai |
| 2008/0284553 A1 | 11/2008 | Lim et al. |

(Continued)

FOREIGN PATENT DOCUMENTS

| | | |
|---|---|---|
| CN | 102483984 A | 5/2012 |
| CN | 104717833 A | 6/2015 |

(Continued)

OTHER PUBLICATIONS

U.S. Appl. No. 16/817,718, filed Mar. 13, 2020.
China Patent Office, "Office Action", No. 202010825074.4, dated Dec. 30, 2021.

*Primary Examiner* — Tszfung J Chan
(74) *Attorney, Agent, or Firm* — Locke Lord LLP; Tim Tingkang Xia, Esq.

(57) ABSTRACT

An inductor device includes a first trace, a second trace, and a capacitor. The first trace includes at least two sub-traces. One terminal of each of the at least two sub-traces are coupled to each other at a first node. The second trace includes at least two sub-traces. One terminal of each of the at least two sub-traces are coupled to each other at a second node. The capacitor is coupled to the firs node and the second node.

19 Claims, 7 Drawing Sheets

(58) Field of Classification Search
CPC ........ H01F 27/29; H01F 27/292; H01F 27/40; H03H 7/0115
USPC .......................... 336/200, 232; 333/175, 185
See application file for complete search history.

(56) References Cited

U.S. PATENT DOCUMENTS

| | | |
|---|---|---|
| 2009/0096413 A1 | 4/2009 | Partovi et al. |
| 2013/0265132 A1 | 10/2013 | Huang et al. |
| 2013/0267185 A1 | 10/2013 | Chen et al. |
| 2016/0268039 A1 | 9/2016 | Park et al. |
| 2016/0336914 A1* | 11/2016 | Wang ........................ H03H 5/12 |
| 2018/0254139 A1 | 9/2018 | Yazaki |
| 2018/0254313 A1 | 9/2018 | Huang et al. |
| 2018/0294089 A1 | 10/2018 | Leong et al. |
| 2020/0177151 A1 | 6/2020 | Pierce et al. |

FOREIGN PATENT DOCUMENTS

| | | |
|---|---|---|
| CN | 110335737 A | 10/2019 |
| CN | 112489922 A | 3/2021 |
| TW | 200535878 A | 11/2005 |
| TW | 201342402 A | 10/2013 |

\* cited by examiner

INDUCTOR DEVICE

RELATED APPLICATIONS

This application claims priority to and the benefit of U.S. Provisional Patent Application No. 62/898,618, filed on Sep. 11, 2019, and Taiwan Application Serial Number 109126927, filed on Aug. 7, 2020, the entire contents of which are incorporated herein by reference as if fully set forth below in its entirety and for all applicable purposes.

BACKGROUND

Field of Invention

The present disclosure relates to an electronic device. More particularly, the present disclosure relates to an inductor device.

Description of Related Art

Radio frequency (RF) devices generates second harmonic, third harmonic, etc. during operation. The harmonics cause negative effect to other circuits. For example, second harmonic of 2.4 GHz circuit is near 5 GHz, and 5 GHz signal causes negative effect to system on chip (SoC).

Conventional way to solve negative effect caused by harmonics is that a filter will be disposed outside of a circuit for filtering the harmonics. However, the filter disposed outside of the circuit will affect function of the circuit and generate additional costs.

SUMMARY

The foregoing presents a simplified summary of the disclosure in order to provide a basic understanding to the reader. This summary is not an extensive overview of the disclosure and it does not identify key/critical elements of the present disclosure or delineate the scope of the present disclosure. Its sole purpose is to present some concepts disclosed herein in a simplified form as a prelude to the more detailed description that is presented later.

One aspect of the present disclosure is to provide an inductor device. The inductor device includes a first trace, a second trace, and a capacitor. The first trace includes at least two sub-traces. One terminal of each of the at least two sub-traces are coupled to each other at a first node. The second trace includes at least two sub-traces. One terminal of each of the at least two sub-traces are coupled to each other at a second node. The capacitor is coupled to the firs node and the second node.

Therefore, based on the technical content of the present disclosure, the capacitor of the inductor device brings a function to filter low frequency, such that low frequency signal induced at the inductor device cannot pass but high frequency signal can pass the capacitor directly. Low frequency signal is, for example, a signal that uses 2.4 GHz as main operating frequency. An induced signal caused by the main operating frequency can be cancelled by the folded inductor of the inductor device. Therefore, the folded inductor will not affect the characteristic of the operating frequency of the inductor. If an inductor which is located at the center of the inductor device has a high frequency signal, for example, a second harmonic (i.e., 5 GHz signal), the high frequency signal may pass the capacitor and form an inductive inductor which is a circle flows through the folded inductor and the capacitor. Therefore, a 5 GHz harmonic signal corresponding to 2.4 GHz signal is induced in the inductor device of the present disclosure. The 5 GHz signal can be used in the circuit. For example, the 5 GHz signal can be amplified and then the amplified 5 GHz signal is used to cancel the 5 GHz harmonic signal of the operating frequency. The amplifying circuit can be arranged by a designer who is familiar with circuit design. As a result, a negative effect to a 5 GHz circuit can be reduced. In addition, since the filter is disposed inside the inductor device of the present disclosure, there is no need to dispose a filter outside of the inductor device, so as to prevent an outer filter from affecting the circuit or prevent additional costs.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

According to the usual mode of operation, various features and elements in the figures have not been drawn to scale, which are drawn to the best way to present specific features and elements related to the disclosure. In addition, among the different figures, the same or similar element symbols refer to similar elements/components.

DESCRIPTION OF THE EMBODIMENTS

To make the contents of the present disclosure more thorough and complete, the following illustrative description is given with regard to the implementation aspects and embodiments of the present disclosure, which is not intended to limit the scope of the present disclosure. The features of the embodiments and the steps of the method and their sequences that constitute and implement the embodiments are described. However, other embodiments may be used to achieve the same or equivalent functions and step sequences.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include the singular. Specifically, as used herein and in the claims, the singular forms "a" and "an" include the plural reference unless the context clearly indicates otherwise.

Figure 1:
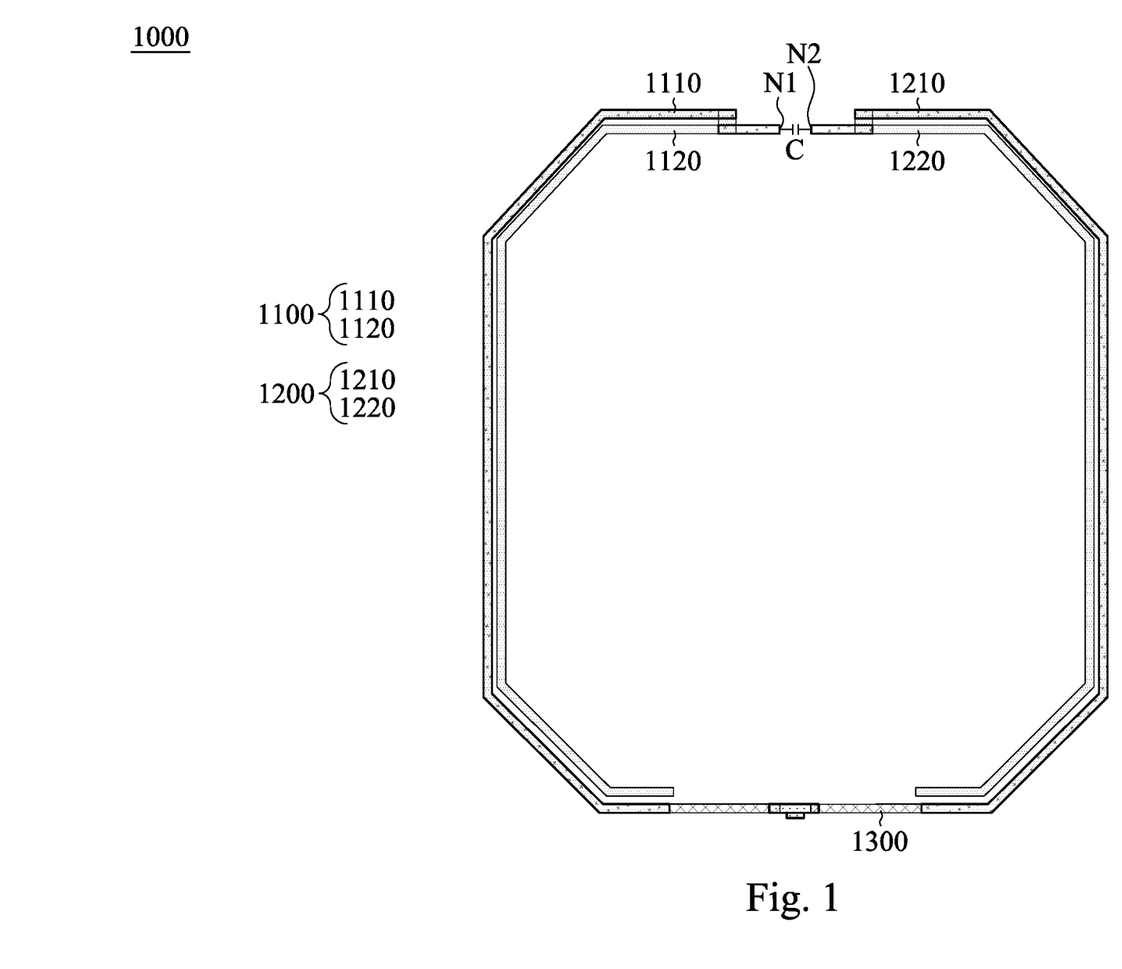
FIG. 1 depicts a schematic diagram of an inductor device according to one embodiment of the present disclosure.

FIG. 1 depicts a schematic diagram of an inductor device 1000 according to one embodiment of the present disclosure. For facilitating the understanding of the inductor device 1000 in FIG. 1, the structure of the inductor device 1000 in FIG. 1 is simplified to be a schematic diagram of the inductor device 1000 as illustrated in FIG. 2A.

Figure 2A:
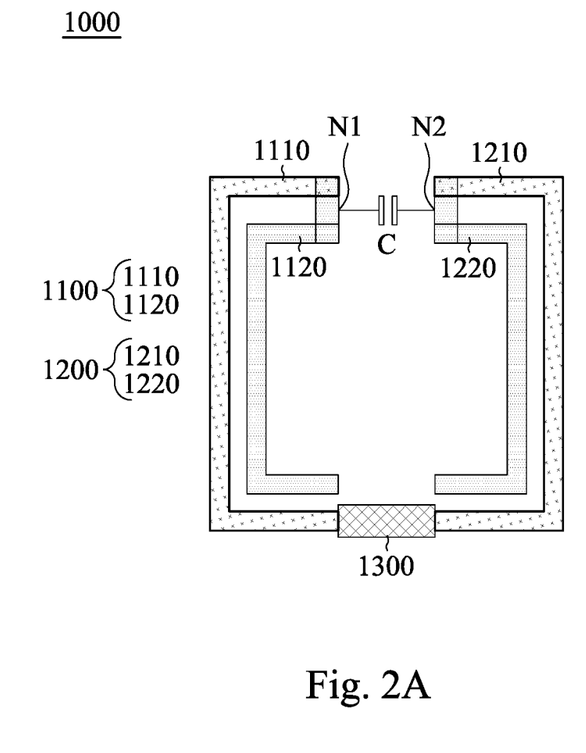
FIG. 2A depicts a schematic diagram of an inductor device according to one embodiment of the present disclosure.

Reference is now made to both FIG. 1 and FIG. 2A. The inductor device 1000 includes a first trace 1100, a second trace 1200 and a capacitor C. In addition, the first trace 1100 includes at least two sub-traces 1110, 1120. The second trace 1200 includes at least two sub-traces 1210, 1220.

In one embodiment, one terminal (e.g., the upper terminal) of each of the at least two sub-traces 1110, 1120 are coupled to each other at a first node N1. One terminal (e.g., the upper terminal) of each of the at least two sub-traces 1210, 1220 are coupled to each other at a second node N2. The capacitor C is coupled between the first node N1 and the second node N2.

In another embodiment, another terminal (e.g., the lower terminal) of one of the at least two sub-traces 1110, 1120 of the first trace 1100 is coupled to another terminal (e.g., the lower terminal) of one of the at least two sub-traces 1210, 1220 of the second trace 1200. For example, the inductor device 1000 further includes a connection element 1300. The lower terminal of the sub-trace 1110 of the first trace 1100 is coupled to the lower terminal of the sub-trace 1210 of the second trace 1200 through the connection element 1300.

In one embodiment, each of the at least two sub-traces 1110, 1120 of the first trace 1100 includes U type sub-trace. For example, the sub-traces 1110, 1120 are all U type sub-traces. Besides, each of the at least two sub-traces 1210, 1220 of the second trace 1200 also includes U type sub-trace. For example, the sub-traces 1210, 1220 are all U type sub-traces. However, the present disclosure is not intended to be limited in the embodiment of FIG. 2A. In other embodiment, the shape of the sub-trace can be other suitable shape depending on actual requirements.

Reference is now made to both FIG. 1 and FIG. 2A, the first trace 1100 includes a first sub-trace 1110 and a second sub-trace 1120. In addition, the first sub-trace 1110 and the second sub-trace 1120 all include a first terminal and a second terminal. As shown in the figure, the first terminal (e.g., the upper terminal) of the first sub-trace 1110 is coupled to the first terminal (e.g., the upper terminal) of the second sub-trace 1120.

Besides, the second trace 1200 includes a third sub-trace 1210 and a fourth sub-trace 1220. In addition, the third sub-trace 1210 and the fourth sub-trace 1220 all include a first terminal and a second terminal. As shown in the figure, the first terminal (e.g., the upper terminal) of the third sub-trace 1210 is coupled to the first terminal (e.g., the upper terminal) of the fourth sub-trace 1220.

In one embodiment, the connection element 1300 of the inductor device 1000 is coupled to the second terminal (e.g., the lower terminal) of the first sub-trace 1110 and the second terminal (e.g., the lower terminal) of the third sub-trace 1210.

In another embodiment, the capacitor C and the connection element 1300 are located at two sides of the inductor device 1000 respectively. For example, the capacitor C is located at an upper side of the inductor device 1000, and the connection element 1300 is located at a lower side of the inductor device 1000. Besides, the present disclosure is not limited to the structures as shown in FIG. 1 and FIG. 2A, and it is merely an example for illustrating one of the implements of the present disclosure.

Figure 2B:
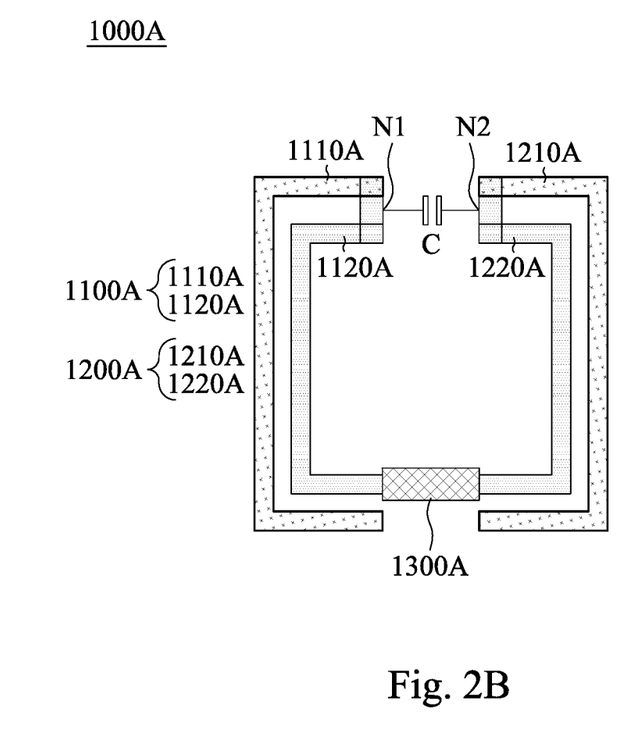
FIG. 2B depicts a schematic diagram of an inductor device according to one embodiment of the present disclosure.

FIG. 2B depicts a schematic diagram of an inductor device 1000A according to one embodiment of the present disclosure. Compared to the inductor device 1000 shown in FIG. 2A, the connection element 1300A of the inductor device 1000A in FIG. 2B is coupled to the second terminal (e.g., the lower terminal) of the second sub-trace 1120A and the second terminal (e.g., the lower terminal) of the fourth sub-trace 1220A. It is noted that, the element in FIG. 2B, whose symbol is similar to the symbol of the element in FIG. 2A, has similar structure feature in connection with the element in FIG. 2A. Therefore, a detail description regarding the structure feature of the element in FIG. 2B is omitted herein for the sake of brevity. Besides, the present disclosure is not limited to the structure as shown in FIG. 2B, and it is merely an example for illustrating one of the implements of the present disclosure.

Figure 3:
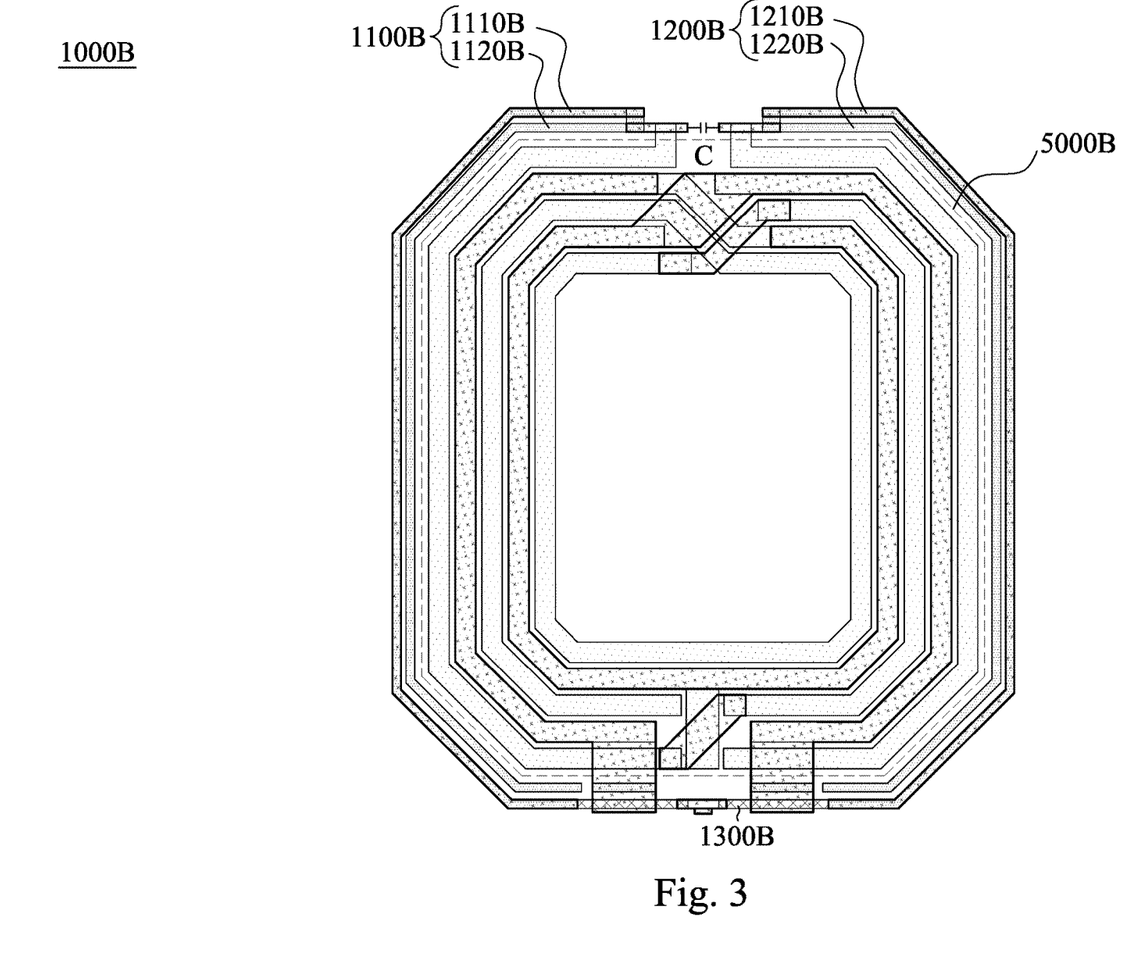
FIG. 3 depicts a schematic diagram of an inductor device according to one embodiment of the present disclosure.

FIG. 3 depicts a schematic diagram of an inductor device 1000B according to one embodiment of the present disclosure. Compared to the inductor device 1000 shown in FIG. 1, an inductor 5000B is disposed inside the inductor device 1000B in FIG. 3. It is noted that, the element in FIG. 3 (e.g., a first trace 1100B, a second trace 1200B, sub-traces 1110B, 1120B, 1210B, 1220B, a connection element 1300B), whose symbol is similar to the symbol of the element in FIG. 1, has similar structure feature in connection with the element in FIG. 1. Therefore, a detail description regarding the structure feature of the element in FIG. 3 is omitted herein for the sake of brevity. Furthermore, the present disclosure is not limited to the structure as shown in FIG. 3, and the type of the inductor 5000B inside the inductor device 1000B can be other suitable type depending on accrual requirements. Moreover, the present disclosure is not limited to the structure as shown in FIG. 3, and it is merely an example for illustrating one of the implements of the present disclosure.

Figure 4:
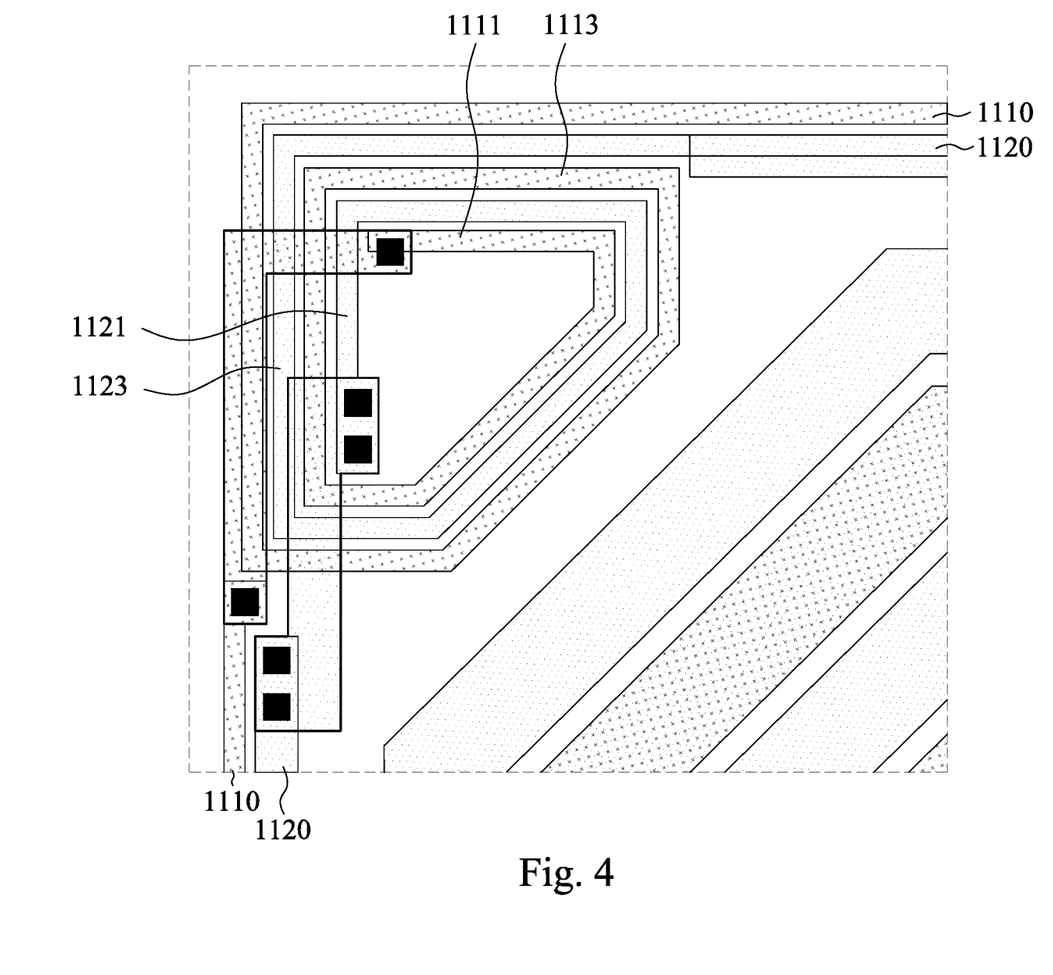
FIG. 4 depicts a schematic diagram of a partial structure of an inductor device according to one embodiment of the present disclosure.

FIG. 4 depicts a schematic diagram of a partial structure of an inductor device according to one embodiment of the present disclosure. The inductor device in FIG. 4 is a partial structure of the inductor device 1000B located at the upper left corner as shown in FIG. 3. Referring to FIG. 4, the first sub-trace 1110 includes a plurality of first windings 1111, 1113, and the second sub-trace 1120 includes a plurality of second windings 1121, 1123. For example, the first sub-trace 1110 can be winded to be a plurality of first windings 1111, 1113, and the second sub-trace 1120 can be winded to be a plurality of second windings 1121, 1123 as well.

Referring to FIG. 4, the first windings 1111, 1113 and the second windings 1121, 1123 are disposed to each other in an interlaced manner. For example, the sequence of the windings can be "the first winding 1111, the second winding 1121, the first winding 1113, the second winding 1123." In one embodiment, a plurality of first windings 1111, 1113 and a plurality of second windings 1121, 1123 are disposed adjacent to the first terminal (e.g., the upper terminal) of the first sub-trace 1110. Furthermore, the present disclosure is not limited to the structure as shown in FIG. 4, and the sub-trace of the inductor device can be disposed in other suitable forms depending on accrual requirements. Besides, the present disclosure is not limited to the structure as shown in FIG. 4, and it is merely an example for illustrating one of the implements of the present disclosure.

In one embodiment, except for disposing the upper left corner of the inductor device 1000B in FIG. 3, the lower left corner of the inductor device 1000B in FIG. 3 can be disposed as well. Therefore, the first sub-trace 1110 further includes a plurality of third windings (not shown), the second sub-trace 1120 further includes a plurality of fourth windings (not shown), and the third windings and the fourth windings are disposed to each other in an interlaced manner. In another embodiment, a plurality of third windings and a plurality of fourth windings are disposed adjacent to the second terminal (e.g., the lower terminal) of the first sub-trace 1110.

In one embodiment, except for disposing the left side of the inductor device 1000B in FIG. 3, the upper right corner of the inductor device 1000B can be disposed as well. Therefore, the third sub-trace 1210 includes a plurality of fifth windings (not shown), and the fourth sub-trace 1220 includes a plurality of sixth windings (not shown). In another embodiment, the third sub-trace 1210 can be winded to be a plurality of fifth windings, and the fourth sub-trace 1220 can be winded to be a plurality of sixth windings as well. The fifth windings and the sixth windings are disposed to each other in an interlaced manner. In one embodiment, a plurality of fifth windings and a plurality of sixth windings are disposed adjacent to the first terminal (e.g., the upper terminal) of the third sub-trace 1210.

In another embodiment, except for disposing the upper right corner of the inductor device 1000B in FIG. 3, the lower right corner of the inductor device 1000B can be disposed as well. Therefore, the third sub-trace 1210 further includes a plurality of seventh windings, and the fourth sub-trace 1220 further includes a plurality of eight windings. The seventh windings and the eight windings are disposed to each other in an interlaced manner. In one embodiment, a plurality of seventh windings and a plurality of eight windings are disposed adjacent to the second terminal (e.g., the lower terminal) of the third sub-trace 1210.

Figure 5:
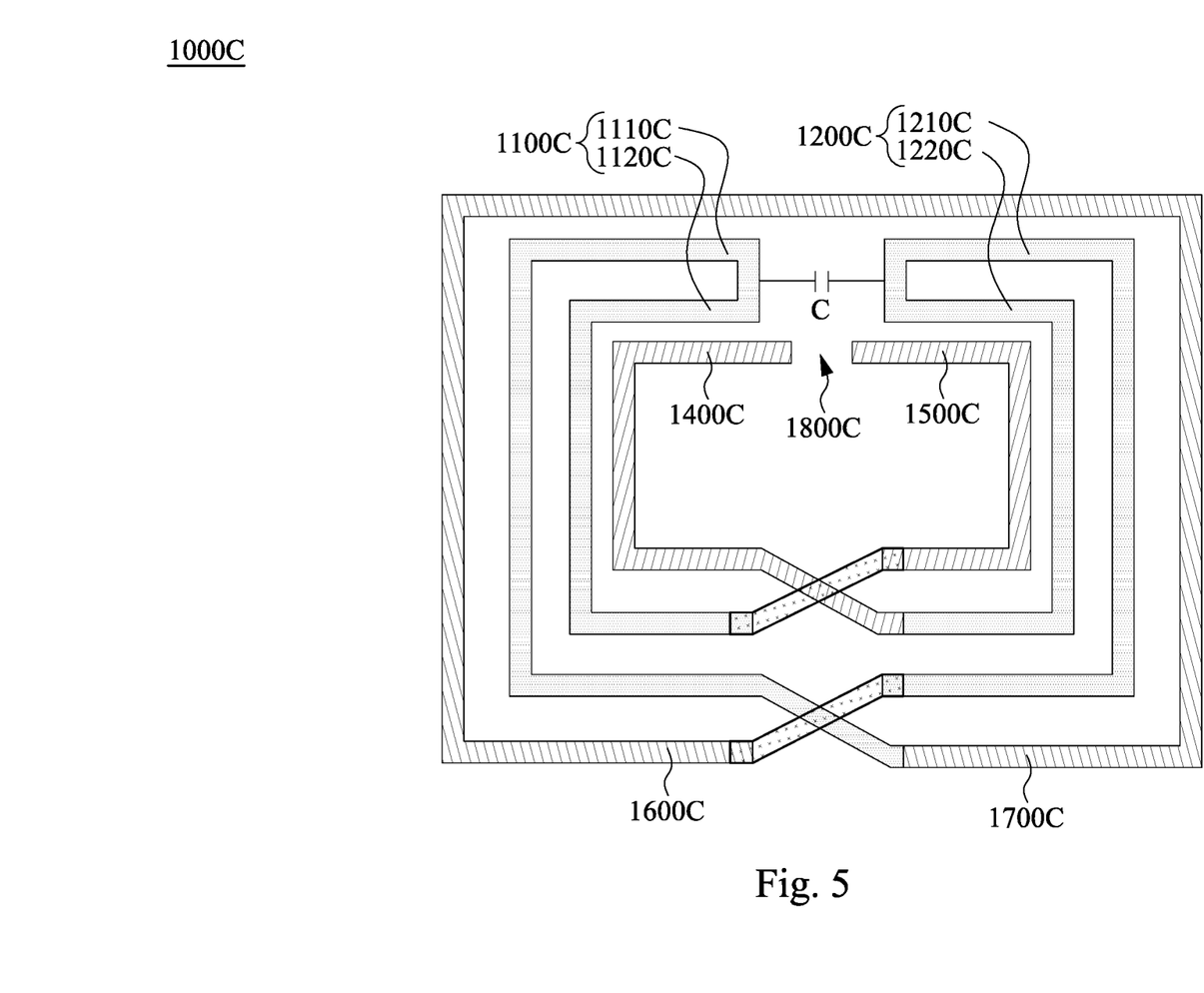
FIG. 5 depicts a schematic diagram of an inductor device according to one embodiment of the present disclosure.

FIG. 5 depicts a schematic diagram of an inductor device according to one embodiment of the present disclosure. Compared to the inductor device 1000 shown in FIG. 2A, the inductor device 1000C in FIG. 5 further includes a third trace 1400C, a fourth trace 1500C, a fifth trace 1600C and a sixth trace 1700C. As shown in FIG. 5, the third trace 1400C and the first trace 1100C are disposed at a first side (e.g., the left side) of the inductor device 1000C, and the third trace 1400C is disposed at and inner side of the inductor device 1000C. In one embodiment, the third trace 1400C is coupled to one of the at least two sub-traces 1210C, 1220C of the second trace 1200C. For example, the third trace 1400C is coupled to the fourth sub-trace 1220C of the second trace 1200C.

In one embodiment, the fourth trace 1500C and the second trace 1200C are disposed at a second side (e.g., the right side) of the inductor device 1000C, and the fourth trace 1500C is disposed at an inner side of the inductor device 1000C. In another embodiment, the fourth trace 1500C is coupled to one of the at least two sub-traces 11100, 1120C of the first trace 1100C. For example, the fourth trace 1500C is coupled to the second sub-trace 1120C of the first trace 1100C.

In another embodiment, the fifth trace 1600C and the first trace 1100C are disposed at the first side (e.g., the left side) of the inductor device 1000C, and the fifth trace 1600C is disposed at an outer side of the inductor device 1000C. In one embodiment, the fifth trace 1600C is coupled to one of the at least two sub-traces 1210C, 1220C of the second trace 1200C. For example, the fifth trace 1600C is coupled to the third sub-trace 1210C of the second trace 1200C.

In one embodiment, the sixth trace 1700C and the second trace 1200C are disposed at the second side (e.g., the right side) of the inductor device 1000C, and the sixth trace 1700C is disposed at the outer side of the inductor device 1000C. In another embodiment, the sixth trace 1700C is coupled to one of the at least two sub-traces 1110C, 1120C of the first trace 1100C. For example, the sixth trace 1700C is coupled to the first sub-trace 1110C of the first trace 11000.

Referring to FIG. 5, the inductor device 1000C further includes an input/output (I/O) terminal 1800C. The I/O terminal 1800C is disposed between the third trace 1400C and the fourth trace 1500C. It is noted that, the element in FIG. 5, whose symbol is similar to the symbol of the element in FIG. 2A, has similar structure feature in connection with the element in FIG. 2A. Therefore, a detail description regarding the structure feature of the element in FIG. 5 is omitted herein for the sake of brevity. Furthermore, the present disclosure is not limited to the structure as shown in FIG. 5, and the disposition of the trace of the inductor device can be other suitable disposition depending on accrual requirements. Moreover, the present disclosure is not limited to the structure as shown in FIG. 5, and it is merely an example for illustrating one of the implements of the present disclosure.

Figure 6:
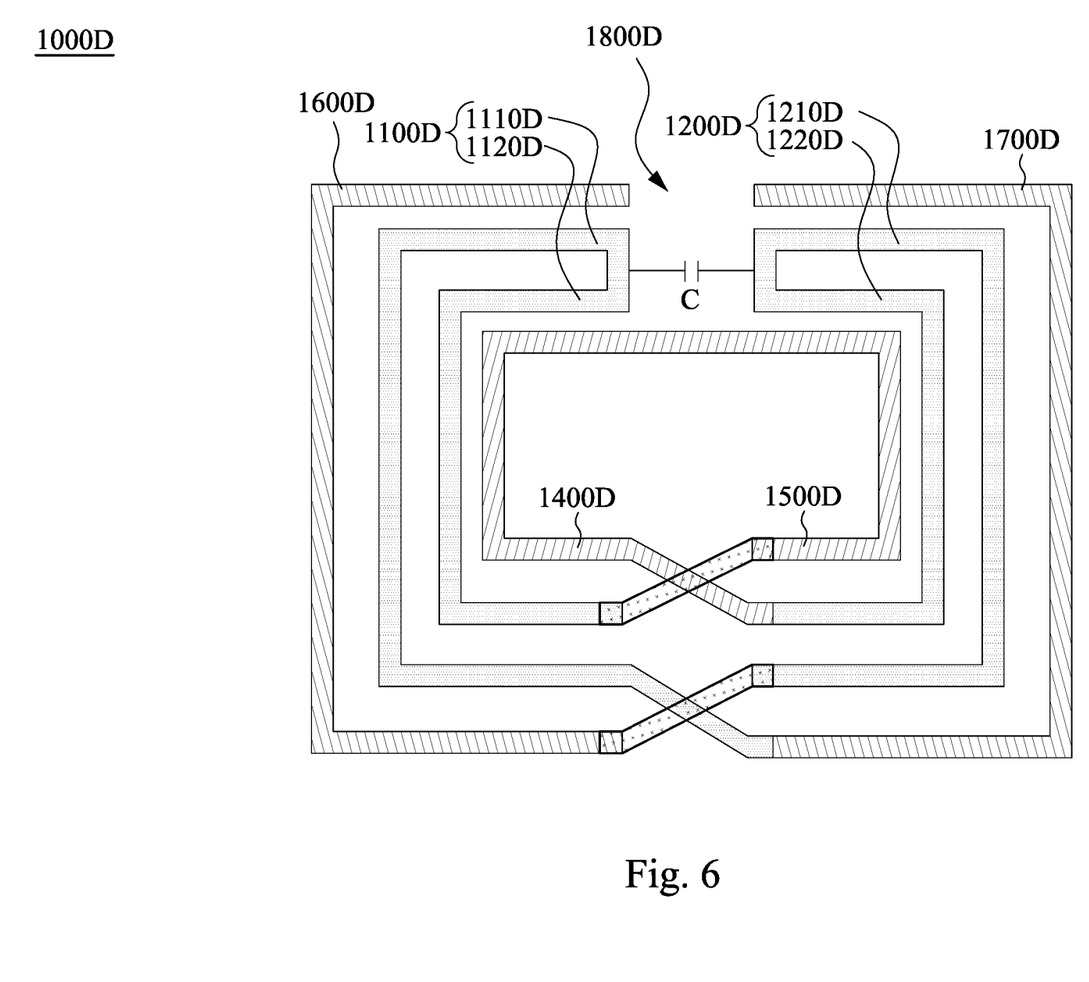
FIG. 6 depicts a schematic diagram of an inductor device according to one embodiment of the present disclosure.

FIG. 6 depicts a schematic diagram of an inductor device 1000D according to one embodiment of the present disclosure. Compared to the inductor device 1000C shown in FIG. 5, the disposition of the I/O terminal 1800D of the inductor device 1000D in FIG. 6 is different. Referring to the inductor device 1000D in FIG. 6, the I/O terminal 1800D is disposed between the fifth trace 1600D and the sixth trace 1700D. It is noted that, the element in FIG. 6, whose symbol is similar to the symbol of the element in FIG. 5, has similar structure feature in connection with the element in FIG. 5. Therefore, a detail description regarding the structure feature of the element in FIG. 6 is omitted herein for the sake of brevity. Furthermore, the present disclosure is not limited to the structure as shown in FIG. 6, and the disposition of the trace of the inductor device can be other suitable disposition depending on accrual requirements. Moreover, the present disclosure is not limited to the structure as shown in FIG. 6, and it is merely an example for illustrating one of the implements of the present disclosure.

Figure 7:
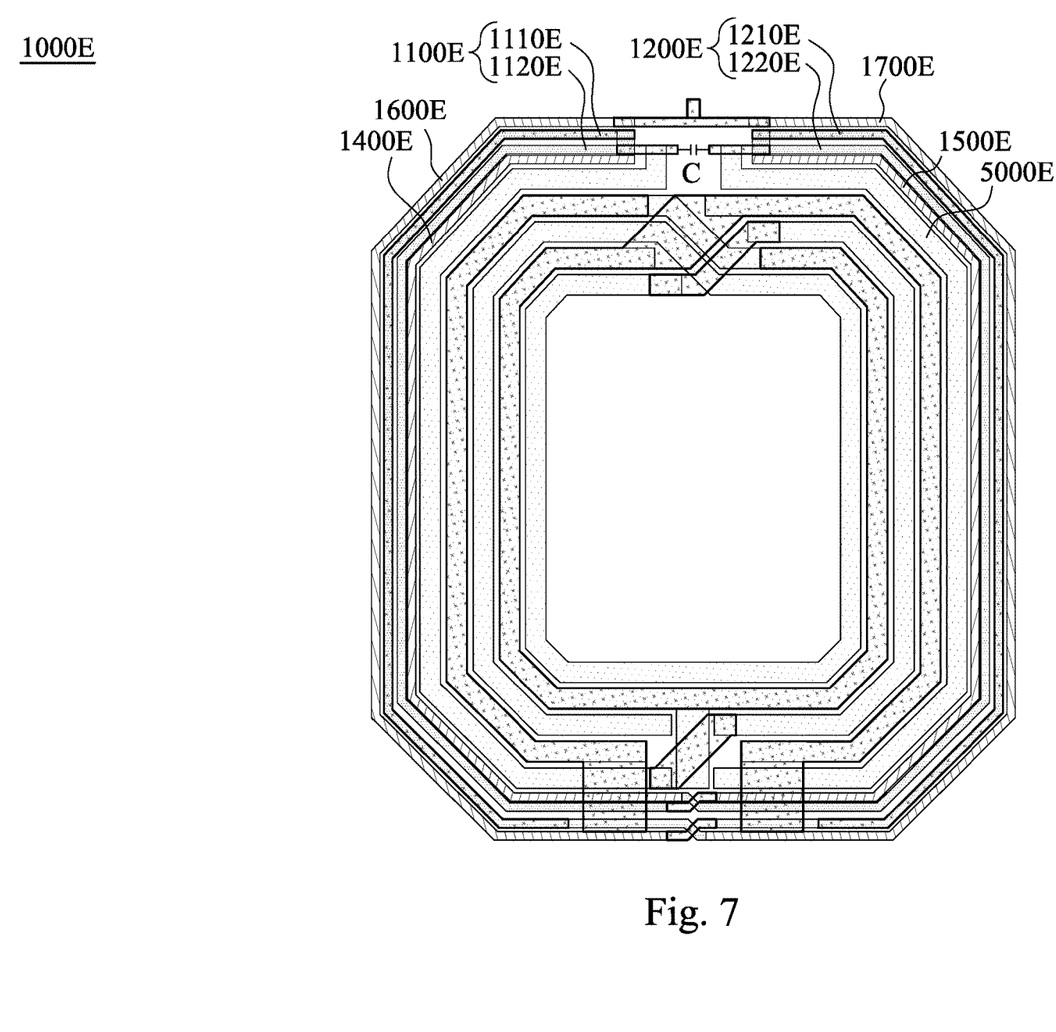
FIG. 7 depicts a schematic diagram of an inductor device according to one embodiment of the present disclosure.

FIG. 7 depicts a schematic diagram of an inductor device 1000E according to one embodiment of the present disclosure. The inductor device 1000E in FIG. 7 is one of the implements of the inductor device 1000D in FIG. 5. Referring to the inductor device 1000E in FIG. 7, the outer structure of the inductor device 1000E (including traces 1100E, 1200E, 1400E, 1500E, 1600E, 1700E and capacitor C) is similar to the inductor device 1000D in FIG. 5. Besides, the inductor device 1000E of FIG. 7 further includes an inductor 5000E which is disposed inside the inductor device 1000E. It is noted that, the element in FIG. 7, whose symbol is similar to the symbol of the element in FIG. 5, has similar structure feature in connection with the element in FIG. 5. Therefore, a detail description regarding the structure feature of the element in FIG. 7 is omitted herein for the sake of brevity. Furthermore, the present disclosure is not limited to the structure as shown in FIG. 7, and the type of the inductor 5000E inside the inductor device 1000E can be other suitable type depending on accrual requirements. Moreover, the present disclosure is not limited to the structure as shown in FIG. 7, and it is merely an example for illustrating one of the implements of the present disclosure.

It can be understood from the embodiments of the present disclosure that application of the present disclosure has the following advantages. The inductor device of the present disclosure may induce high frequency signal (e.g., second harmonic) of inductor (e.g., 5000B, 5000E) inside the inductor device. After the high frequency signal is amplified by additional circuit, the amplified high frequency signal is able to cancel negative effect to the circuit caused by second harmonic. For example, the capacitor of the inductor device is used to let high frequency signal pass and block low frequency signal. Therefore, the inductor device is able to deal with signals in high frequency or low frequency by two kinds of inducing manner. In addition, since the filter is disposed inside integrated circuit (IC), for example, the inductor device, of the present disclosure, there is no need to dispose a filter outside of the inductor device, so as to prevent an outer filter from affecting the circuit or prevent additional costs.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An inductor device, comprising:
    a first trace, comprising:
        at least two sub-traces, wherein one terminal of each of the at least two sub-traces are coupled to each other at a first node;
    a second trace, comprising:
        at least two sub-traces, wherein one terminal of each of the at least two sub-traces are coupled to each other at a second node; and
    a capacitor, coupled between the first node and the second node;
    wherein each of the at least two sub-traces of the first trace comprises U type sub-trace, wherein each of the at least two sub-traces of the second trace comprises U type sub-trace, wherein two terminals of each of the at least two sub-traces of the first trace are located at opposite sides of the inductor device, wherein two terminals of each of the at least two sub-traces of the second trace are located at opposite sides of the inductor device.

2. The inductor device of claim 1, wherein another terminal of one of the at least two sub-traces of the first trace is coupled to another terminal of one of the at least two sub-traces of the second trace.

3. The inductor device of claim 2, wherein the at least two sub-traces of the first trace comprise:
    a first sub-trace, comprising:
        a first terminal; and
        a second terminal; and
    a second sub-trace, comprising:
        a first terminal, coupled to the first terminal of the first sub-trace; and
        a second terminal.

4. The inductor device of claim 3, wherein the at least two sub-traces of the second trace comprise:
    a third sub-trace, comprising:
        a first terminal; and
        a second terminal; and
    a fourth sub-trace, comprising:
        a first terminal, coupled to the first terminal of the third sub-trace; and
        a second terminal.

5. The inductor device of claim 4, further comprising:
    a connection element, coupled to the second terminal of the first sub-trace and the second terminal of the third sub-trace, or coupled to the second terminal of the second sub-trace and the second terminal of the fourth sub-trace.

6. The inductor device of claim 5, wherein the capacitor and the connection element are located at two sides of the inductor device respectively.

7. The inductor device of claim 6, wherein the first sub-trace comprises a plurality of first windings, and the second sub-trace comprises a plurality of second windings, wherein the first windings and the second windings are disposed to each other in an interlaced manner.

8. The inductor device of claim 7, wherein the first sub-trace further comprises a plurality of third windings, and the second sub-trace further comprises a plurality of fourth windings, wherein the third windings and the fourth windings are disposed to each other in an interlaced manner.

9. The inductor device of claim 8, wherein the first windings and the second windings are disposed adjacent to the first terminal of the first sub-trace.

10. The inductor device of claim 9, wherein the third windings and the fourth windings are disposed adjacent to the second terminal of the first sub-trace.

11. The inductor device of claim 10, wherein the third sub-trace comprises a plurality of fifth windings, and the fourth sub-trace comprises a plurality of sixth windings, wherein the fifth windings and the sixth windings are disposed to each other in an interlaced manner.

12. The inductor device of claim 11, wherein the third sub-trace further comprises a plurality of seventh windings, and the fourth sub-trace further comprises a plurality of eight windings, wherein the seventh windings and the eight windings are disposed to each other in an interlaced manner.

13. The inductor device of claim 12, wherein the fifth windings and the sixth windings are disposed adjacent to the first terminal of the third sub-trace.

14. The inductor device of claim 13, wherein the seventh windings and the eight windings are disposed adjacent to the second terminal of the third sub-trace.

15. The inductor device of claim 14, further comprising:
    a third trace, wherein the first trace and the third trace are disposed at a first side of the inductor device, and the third trace is disposed at an inner side of the inductor device, wherein the third trace is coupled to one of the at least two sub-traces of the second trace.

16. The inductor device of claim 15, further comprising:
    a fourth trace, wherein the second trace and the fourth trace are disposed at a second side of the inductor device, and the fourth trace is disposed at an inner side of the inductor device, wherein the fourth trace is coupled to one of the at least two sub-traces of the first trace.

17. The inductor device of claim 16, further comprising:
    a fifth trace, wherein the first trace and the fifth trace are disposed at the first side of the inductor device, and the fifth trace is disposed at an outer side of the inductor device, wherein the fifth trace is coupled to one of the at least two sub-traces of the second trace.

18. The inductor device of claim 17, further comprising:
a sixth trace, wherein the second trace and the sixth trace are disposed at the second side of the inductor device, and the sixth trace is disposed at an outer side of the inductor device, wherein the sixth trace is coupled to one of the at least two sub-traces of the first trace.

19. The inductor device of claim 18, further comprising:
an input/output terminal disposed between the third trace and the fourth trace, or disposed between the fifth trace and the sixth trace.

\* \* \* \* \*